(12) United States Patent
Gazeley

(10) Patent No.: US 7,408,140 B2
(45) Date of Patent: Aug. 5, 2008

(54) PIXEL WITH SPATIALLY VARYING METAL ROUTE POSITIONS

(75) Inventor: William G. Gazeley, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/678,986

(22) Filed: May 14, 2007

(65) Prior Publication Data

US 2007/0205356 A1    Sep. 6, 2007

Related U.S. Application Data

(62) Division of application No. 11/123,782, filed on May 6, 2005, now Pat. No. 7,214,920.

(51) Int. Cl.
*H01L 27/00* (2006.01)
*H01L 31/062* (2006.01)
*G01J 1/44* (2006.01)

(52) U.S. Cl. ............................ 250/208.1; 250/214 R; 257/291

(58) Field of Classification Search ............. 250/208.1, 250/214.1, 216, 226, 214 R; 257/290–293, 257/203, 433, 431, 443; 348/272, 294, 298
See application file for complete search history.

(56) References Cited

U.S. PATENT DOCUMENTS

| | | | |
|---|---|---|---|
| 5,504,355 | A | 4/1996 | Hatano |
| 5,576,763 | A | 11/1996 | Ackland et al. |
| 5,841,126 | A | 11/1998 | Fossum et al. |
| 5,920,345 | A | 7/1999 | Sauer |
| 5,990,850 | A | 11/1999 | Brown et al. |

(Continued)

OTHER PUBLICATIONS

Peter B. Catrysse et al., "Optical Efficiency of Image Sensor Pixels," Optical Society of America, vol. 19, No. 8, Aug. 2002, pp. 1601-1620.

(Continued)

*Primary Examiner*—Georgia Y. Epps
*Assistant Examiner*—Don Williams
(74) *Attorney, Agent, or Firm*—RatnerPrestia

(57) ABSTRACT

A method for configuring an image sensor including an array of pixels having an optical center, each pixel of the array including a metal segment disposed in a second metal layer and an interlayer connect element coupled between the metal segment and a first metal layer. The method includes modeling a base pixel configuration for each pixel of the array, the base pixel configuration including the metal segment at a first position in the second metal layer, and the first interlayer connect element at a second position which is coincident with the first position. The method further includes, for each pixel of the array, determining a shift distance for the pixel based on a distance of the pixel from the optical center, determining a direction of the pixel from the optical center, shifting the metal segment from the first position toward the optical center by the shift distance, shifting the interlayer connect element from the second position toward the optical center by the shift distance if the pixel is in a first direction from the optical center, and maintaining the via at the second position and providing a span element to couple the metal segment at the shifted location to the interlayer connect element if the pixel is on a second direction from the optical center.

19 Claims, 8 Drawing Sheets

U.S. PATENT DOCUMENTS

| | | | |
|---|---|---|---|
| 6,057,586 | A | 5/2000 | Bawolek |
| 6,194,770 | B1 | 2/2001 | Zarnowski |
| 6,225,670 | B1 | 5/2001 | Dierickx |
| 6,235,549 | B1 | 5/2001 | Bawolek et al. |
| 6,278,169 | B1 | 8/2001 | Sayuk et al. |
| 6,288,434 | B1 | 9/2001 | Levy |
| 6,352,869 | B1 | 3/2002 | Guidash |
| 6,369,417 | B1 | 4/2002 | Lee |
| 6,376,868 | B1 | 4/2002 | Rhodes |
| 6,466,266 | B1 | 10/2002 | Guidash et al. |
| 6,555,842 | B1 | 4/2003 | Fossum et al. |
| 6,570,617 | B2 | 5/2003 | Fossum et al. |
| 6,744,068 | B2 | 6/2004 | Fossum et al. |
| 6,777,662 | B2 | 8/2004 | Drowley et al. |
| 6,815,787 | B1 | 11/2004 | Yaung et al. |
| 6,838,715 | B1 * | 1/2005 | Bencuya et al. ............ 257/291 |
| 6,861,686 | B2 | 3/2005 | Lee et al. |
| 6,930,299 | B2 | 8/2005 | Ohkaw |
| 7,138,618 | B2 | 11/2006 | Mishina |
| 2003/0103150 | A1 | 6/2003 | Catrysse et al. |
| 2006/0104564 | A1 | 5/2006 | Catrysse |

OTHER PUBLICATIONS

Peter B. Catrysse et al., "Integrated Color Pixels in 0.18-um Complementary Metal Oxide Semiconductor Technology," Optical Society of America, vol. 20, No. 12, Dec. 2003, pp. 2293-2306.

Dun-Nian Yaung et al., "Air-Gap Guard Ring for Pixel Sensitivity and Crosstalk Improvement in Deep Sub-micron CMOS Image Sensor," IEEE, 2003. pp. 16.5.1-16.5.4.

* cited by examiner

PIXEL WITH SPATIALLY VARYING METAL ROUTE POSITIONS

CROSS-REFERENCE TO RELATED APPLICATION

This application is a divisional application of U.S. patent application Ser. No. 11/123,782, filed May 6, 2005 now U.S. Pat. No. 7,214,920, entitled "PIXEL SPATIALLY VARYING METAL ROUTE POSITIONS," priority to which is claimed under 35 U.S.C. §121 and which is incorporated herein by reference.

BACKGROUND

Solid-state image sensors (also known as "solid-state imagers," "image sensors," and "imagers") have broad applications in many areas and in a number of fields. Solid-state image sensors convert a received image into a signal indicative of the received image. Examples of solid-state image sensors include charge coupled devices ("CCD"), photodiode arrays, and CMOS imaging devices (also known as "CMOS image sensors" or "CMOS imaging arrays").

Solid-state image sensors are fabricated from semiconductor materials, such as silicon or gallium arsenide, and comprise imaging arrays of light detecting, i.e., photosensitive, elements (also known as "photodetectors" or "photoreceptors") interconnected to generate analog signals representative of an image illuminating the device. A typical imaging array comprises a number of photodetectors arranged into rows and columns, each photodetector generating photo-charges. The photo-charges are the result of photons striking the surface of the semiconductor material of the photodetector, and generating free charge carriers (electron-hole pairs) in an amount linearly proportional to the incident photon radiation. The photo-charges from each pixel are converted to a "charge signal" which is an electrical potential representative of the energy level reflected from a respective portion of the object and received by the solid-state image sensor. The resulting signal or potential is read and processed by video/image processing circuitry to create a signal representation of the image.

In recent years, CMOS image sensors have become a practical implementation option for imagers and provide cost and power advantages over other technologies such as CCD or CID. A conventional CMOS image sensor is typically structured as an imaging array of pixels, each pixel including a photodetector and a transistor region, and as discussed above, each pixel converts the incoming light into an electronic signal.

One type of active pixel design for a CMOS image sensor, often referred to as a pinned-diode pixel, includes four wires (or "metal interconnect lines" or "metal interconnect segments"), a photodetector (i.e. a photodiode), and three transistors, namely a reset transistor, a source-follower transistor, and an access transistor (or "transfer gate"). The photodiode and transistors are located in active areas of a silicon substrate that forms a floor to the pixel. Two of the metal interconnect segments are disposed in a first metal layer (generally referred to as metal-1), which is positioned above a poly-silicon layer formed on the silicon substrate, and provide reset and access ("transfer") signals to the pixel.

The two remaining metal interconnect segments disposed perpendicularly to the first two metal interconnect segments in a second metal layer (generally referred to as metal-2), which is positioned above a dielectric insulation layer over the first metal layer, and provide power and column selection to the pixel. Conductive contacts couple the metal-1 layer to the poly-silicon layer and to the active areas of the silicon substrate, and conductive vias couple the metal-2 layer to the metal-1 layer. The contacts and via enable the metal interconnect segments to be in electrical communication with one another and with the poly-silicon layer and silicon substrate of the pixel. In a typical three-transistor active pixel design for a CMOS image sensor, each pixel includes four wires (or "metal interconnect lines" or "metal interconnect segments") and three transistors, namely, a reset transistor, a source-follower transistor, and a select transistor. Two metal interconnect segments are disposed horizontally to provide row selection for either resetting the pixel or reading the pixel. Two other metal interconnect segments are disposed vertically (or substantially perpendicular to the first two metal interconnect segments) to provide column selection for both reading and resetting the pixel.

In conventional CMOS image sensors, the arrangement of the pixel's structures, including the relative positioning of the photodetector, the transistor region, and the metal interconnect segments, as well other structural elements, has presented problems. A major problem which conventional CMOS image sensors exhibit is pixel light shadowing (also referred to as "geometric shadowing"). Pixel light shadowing is caused when the average ray or principal ray striking the pixel deviates significantly from normal (or perpendicular to the imaging array plane). Under these conditions, one or more of the pixel elements situated over the photodetector may block a significant amount of light from being directed at the photodetector. As a result, the brightness of the resulting image can be significantly reduced, resulting in poor image quality

SUMMARY

In one aspect, the present invention provides an image sensor including an array of pixels having an optical center, the array including a first pixel substantially at a first distance from the optical center in a first direction and a second pixel substantially at the first distance from the optical center in a second direction which is opposite the first direction. The first pixel includes a first metal segment and a first interlayer connect element. The first metal segment is positioned in a second metal layer at a shift distance toward the optical center from a first position. The first interlayer connect element is coupled between the first metal segment and a first metal layer and is positioned at the shift distance toward the optical center from a second position, wherein the second position is coincident with the first position. The second pixel includes a second metal segment, a second interlayer connect element, and a span element. The second metal segment is positioned in the second metal layer at the shift distance toward the optical center from a third position. The second interlayer connect element is coupled between the first and second metal layers, the interlayer connect element positioned at a fourth position which is coincident with the third position. The span element is coupled to and extends from the second metal segment in generally the second direction and is coupled to the second interlayer connect element.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
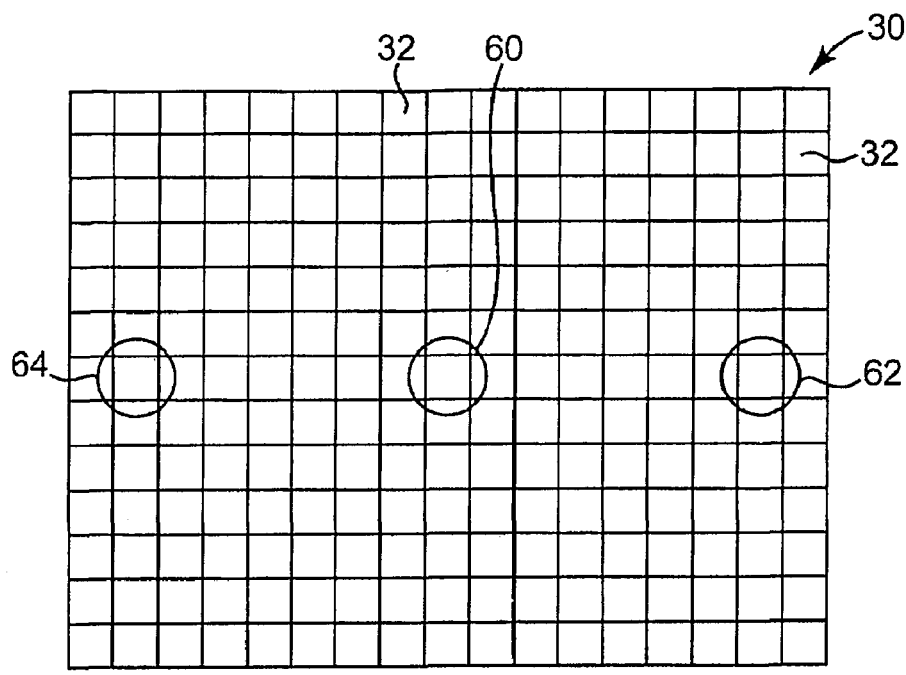
FIG. 1 is a block diagram illustrating generally a CMOS imaging array.

FIG. 1 is a block diagram illustrating generally a CMOS imaging array 30 including a plurality of pixels 32 arranged in a plurality of rows and columns, with each pixel 32 generating photo-charges from received light representative of an image. The photo-charges generated by pixels 32 are the result of photons striking the surface of a semiconductor material, or photodetector (e.g. photodiode and photogate), and generating free charge carriers (i.e. electron hole pairs) in an amount linearly proportional to the incident photon radiation. As will be described in greater detail below, each pixel 32 includes metallic interconnect segments and vias that can be shifted based on their position relative to an optical center of array 30, in accordance with the present invention, so as to increase the photon radiation incident upon the semiconductor material.

Figure 2:
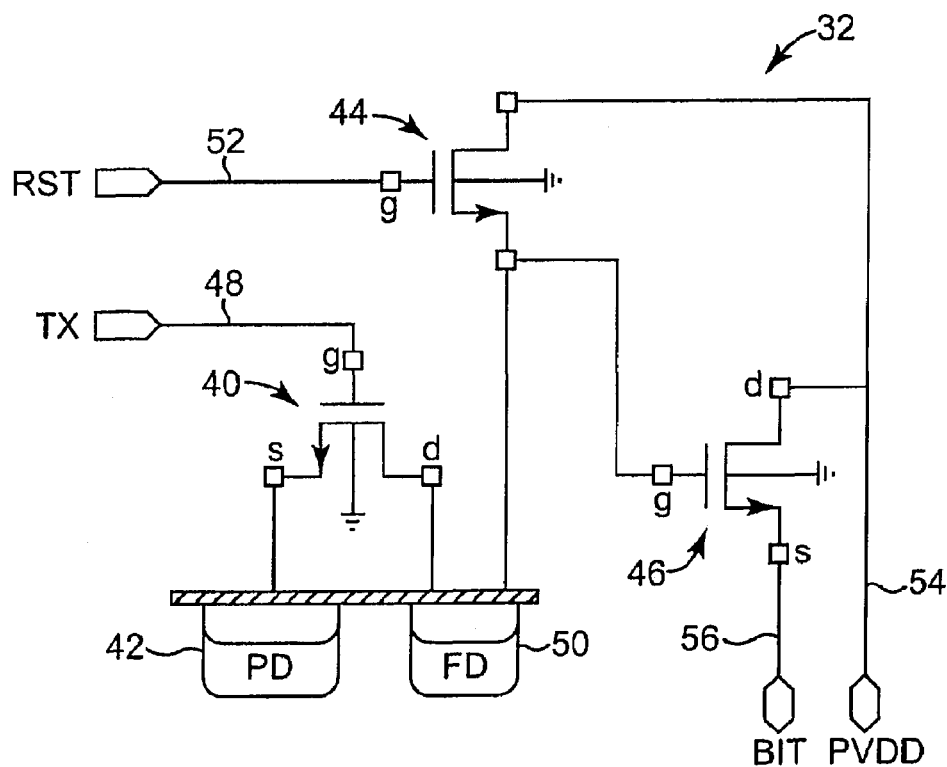
FIG. 2 is a block and schematic diagram illustrating a pixel of the CMOS imaging array of FIG. 1.

FIG. 2 is a schematic diagram illustrating one example configuration of a pixel 32, commonly referred to as a buried-gated photodiode type pixel. Pixel 32 includes a photodetector 40, an access transistor 42 (often referred to as a "transfer gate"), a reset transistor 44, and a source follower transistor 46. The gate of transfer gate 40 is coupled to an access or transfer (TX) line 48, the source is coupled to photodiode (PD) 42, and the drain is coupled to a floating diffusion region (FD) 50. The gate of reset transistor 44 is coupled to a reset (RST) line 52, the source is coupled to FD 50, and the drain is coupled to a voltage line (PVDD) 54. The gate of source-follower transistor 46 is coupled to the source of reset transistor 44, the source is coupled to a column or bit (BIT) line 56, and the drain is coupled to PVDD 54. Although only one pixel 32 is illustrated, TX, RST lines 48, 52 extend across all pixels of a given row of array 30, and PVDD and BIT lines 54, 56 extend across all pixels of a given column of array 30.

Pixel 32 operates in two modes, integration and readout, based on signals received via TX 48 and RST lines 48, 52. Initially, pixel 32 is in a reset state with transfer gate 48 and reset transistor 52 turned on. To begin integrating, reset transistor 52 and transfer gate 48 are turned off. During the integration period, PD 42 accumulates a photo-generated charge that is proportional to the photon radiation that propagates through portions of pixel 32 and is incident upon photodetector 42.

After pixel 32 has integrated for a desired time period, reset transistor 44 is turned on and the reset level of FD 50 is sampled at BIT line 56 via source-follower transistor 46. Subsequently, transfer gate 40 is turned on and the accumulated charge is transferred from PD 42 to FD 50. The charge transfer causes the potential of FD 50 to deviate from the reset value, which is approximately equal to the level of PVDD line 54 minus a threshold voltage, to a signal value which is depends on the accumulated charge. The signal value is then sampled, or read, at BIT line 56 via source-follower transistor 46. The difference between the sampled signal value and the sampled reset value constitutes an image signal for pixel 32 and is proportional to the intensity of the light incident upon PD 42.

Following readout of the row of pixels in which pixel 32 is located, FD 50 is returned to ground to turn off source-follower transistor 46. Because all source-follower transistors of the pixels of each column constitute a wired-or circuit, returning FD 50 to ground ensures that only one source-follower transistor at a time will be turned on in a given column. FD 50 is returned to ground by temporarily driving PVDD 54 to a low voltage level (typically ground) and then pulsing RST 52 high which, in-turn, sets the floating diffusion area of each pixel in a given row (such as FD 50) to the voltage level of PVDD 54 (which as described above, has previously been driven to ground).

Figure 3:
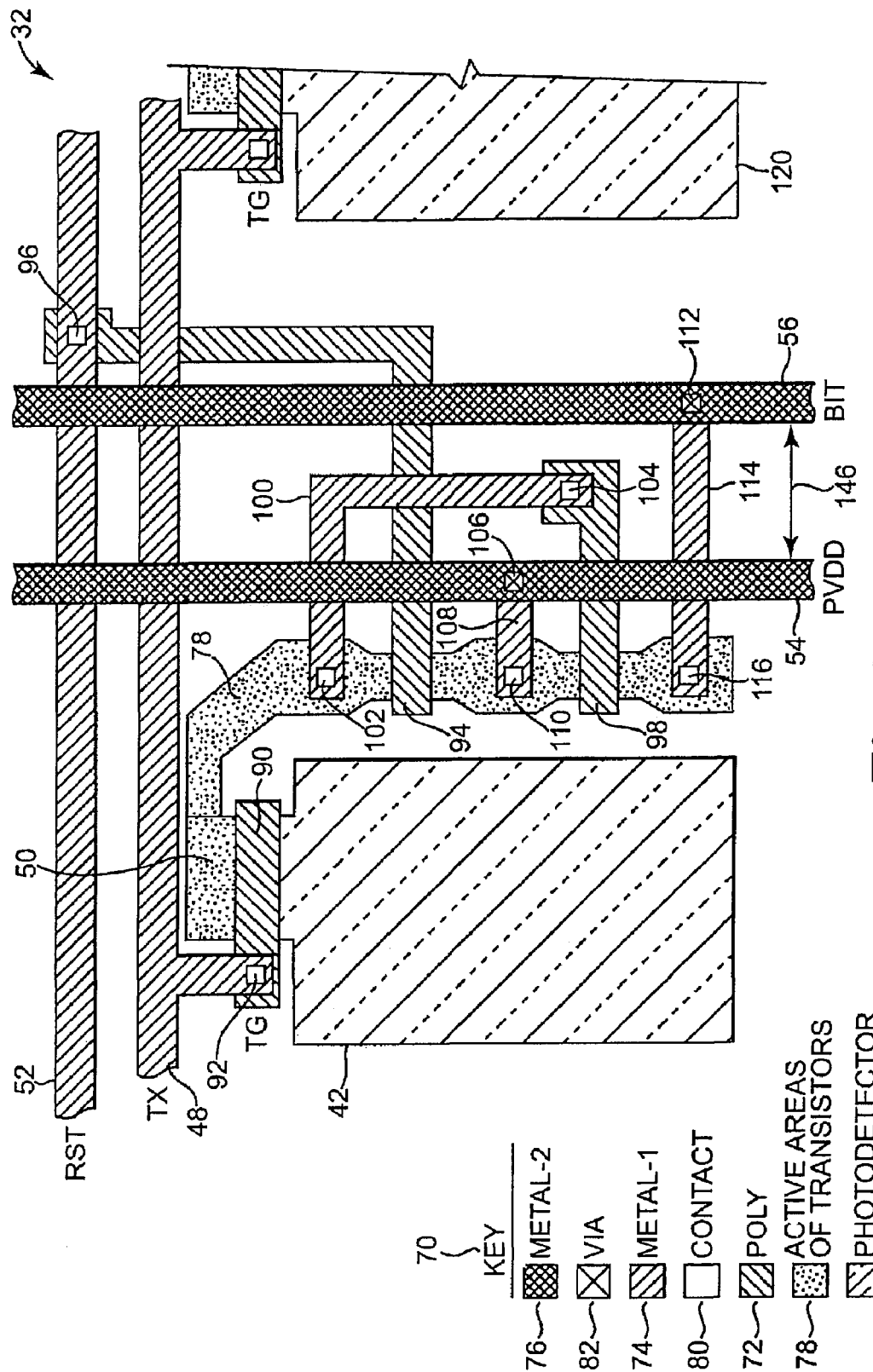
FIG. 3 is an example layout of the pixel of FIG. 2 according to the present invention.

FIG. 3 illustrates an example layout of pixel 32 as illustrated by FIG. 2 when located in a region 60 (see FIG. 2) which is proximate to an optical center of array 30. The elements of pixel 32 are disposed in various layers which overlay a silicon substrate which forms the "floor" of pixel 32. In the illustrated example, with reference to drawing key 70, pixel 32 includes a polysilicon layer ("poly") 72 overlaying the silicon substrate, a first metal layer ("metal-1") 74 positioned above poly 72, and a second metal layer (metal-2) 76 positioned above poly 72. Dielectric insulation layers (not illustrated) are positioned between poly 72 and metal-1 74, and between metal-1 74 and metal-2 76. Pixel 32 includes additional material layers which, for ease of illustration, are not described or discussed herein.

PD 42, FD 50, and active areas 78 of the transistors are disposed in active regions (i.e. doped regions) of the silicon substrate. Contacts, illustrated at 80 provide conductive pathways to couple metal-1 74 to active areas 78 of the transistors, and to couple metal-1 74 to poly 72. Vias, indicated at 82, provide conductive pathways to couple metal-2 76 to metal-1 74.

TX and RST lines 48, 52 are disposed in metal-1 74 and PVVD and BIT lines 54, 56 are disposed in metal-2 76 and respectively extend horizontally and vertically (with respect to FIG. 3) across pixel 32. A segment 90 of poly 74 is positioned over PD 40 and FD 50 to form the gate of transfer gate 40. TX line 54 is coupled to segment 90 of poly 72 via a contact 92. A segment 94 of poly 72 is positioned over active area 78 to form the gate of reset transistor 44, and extends and is coupled to RST line 52 by contact 96. A segment 98 of poly 72 is positioned over active area 78 to form the gate of source-follower transistor 46. A first end of a segment 100 of metal-1 74 is coupled by a contact 102 to the source of reset transistor 44 in active area 78, and a second end is coupled by a contact 104 to segment 98 of poly 72, thereby coupling the source of reset transistor 44 to the gate of source-follower transistor 46. The source of reset transistor 44 is coupled to FD 50 via active area 78.

PVDD line 54 is coupled by a via 106 to a first end of a segment 108 of metal-1 74 which, in-turn, is coupled at a second end to the drains of reset and source-follower transistors 44, 46 by a contact 110. BIT line 56 is coupled by a via 112 to a first end of a segment 114 of metal-1 74 which, in-turn, is coupled at a second end to the source of source-follower transistor 46 by a contact 116. The photodetector of an adjacent pixel is illustrated at 120.

It is noted that FIG. 3 is included for illustrative purposes only and is not drawn to scale. As such, element sizes, spacing between elements, and relative position of elements with respect to one another have been exaggerated for ease of illustration and are not intended to exactly represent actual pixel structures.

It should also be noted that vias (e.g. vias 106 and 112) and contacts (e.g. 96, 102, 104, etc.) can be generally described as interlayer connect elements. As the name suggests, such interlayer connect elements function as "conduits" to electrically couple non-contacting layers to one another. The terms "via" and "connect" are used only for illustrative purposes to differentiate between connections between the metal-1 and metal-2 layers and between the metal-1 and the silicon substrate and/or the polysilicon layer.

Figure 4:
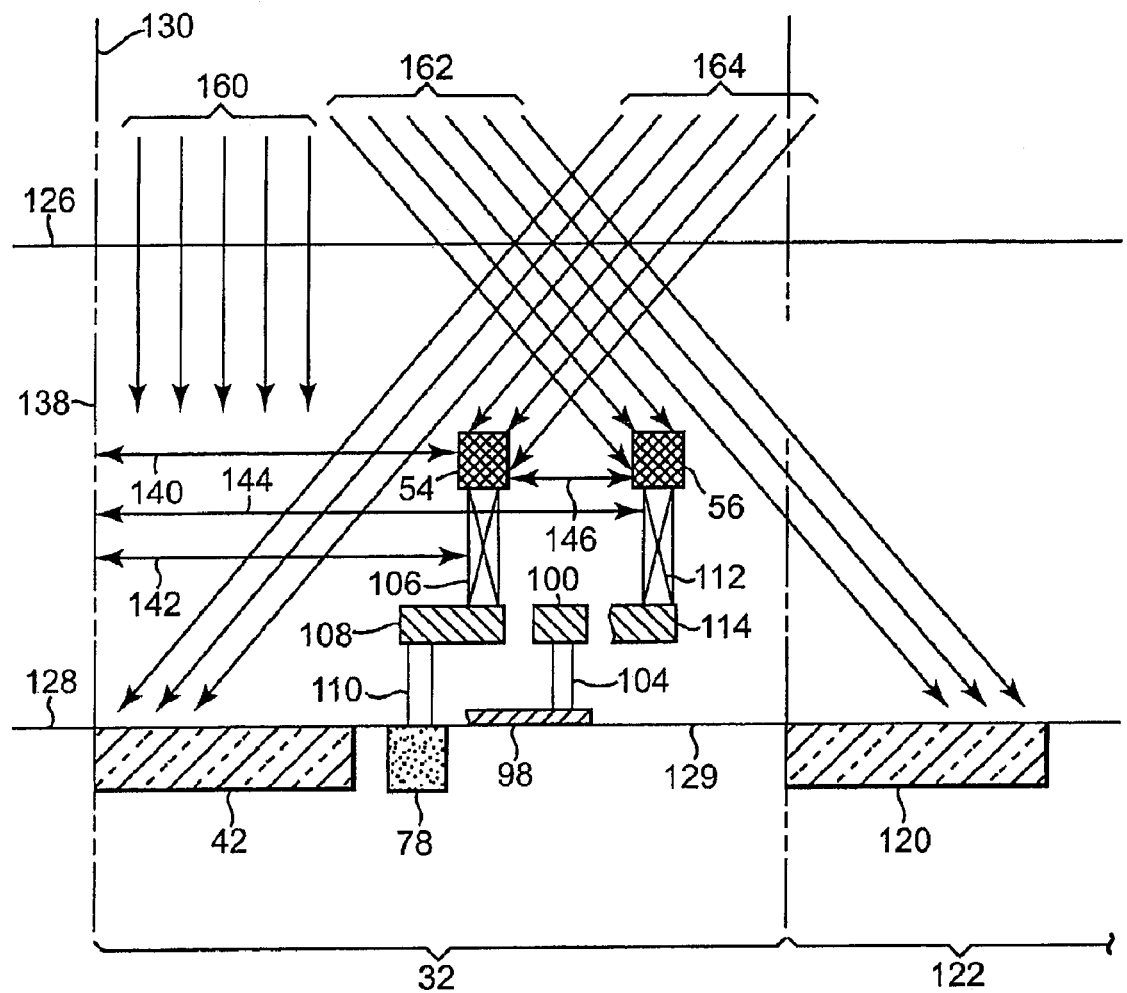
FIG. 4 is a cross-sectional view illustrating portions of the pixel of FIG. 3.

FIG. 4 is a cross-sectional view of pixel 32 as illustrated by FIG. 3. A surface plane of array 30 and a surface plane of the silicon substrate in which PD 42 and the active areas 78 of the transistors positioned are respectively illustrated at 126 and 128. An isolation area 129 separates pixel 32 from the adjacent pixel 122. For ease of illustration, not all components of pixel 32 from FIG. 3 are illustrated, nor are other pixel components such as, for example, micro-lenses, color filters, and various transparent dielectric layers. Again, as with FIG. 3, FIG. 4 is intended for illustrative purposes only.

As described above, pixel 32 of FIG. 3 and FIG. 4 is located in region 60 (see FIG. 1) proximate to an optical center 130 of array 30. Optical axis 130 corresponds to a reference line perpendicular to the surface plane 126 of and intersecting a center of array 30. As illustrated, PVDD line 54, via 106, and via 112 are respectively positioned at distances 140, 142 and 144 from an edge 138 of pixel 32, which is proximate to PD 42. BIT line 56 is positioned at a distance 148 from PVDD line 54.

Generally speaking, pixel 32 of FIG. 4 is configured in a conventional fashion wherein PVDD and BIT lines 54, 56 of metal-2 76, segments 108, 114 of metal-1 74, and vias 106, 112 are positioned over active transistor areas 78 and isolation area 129 so as to keep the area between PD 42 and surface plane 126 free of metal interconnects so that light to PD 42 is not "blocked" by such obstacles. In most conventional imaging arrays, the conventional pixel configuration of pixel 32 as illustrated by FIG. 3 and FIG. 4 is identical for all pixels of the array. In other words, each pixel of array 30 is identically arranged with a fixed pitch. Thus, distances 140, 142, and 144 from edge 138 to PVDD line 54, via 106, via 112, and between PVDD and BIT lines 54, 56 are the same for each pixel of the array.

When pixel 32 is proximate to optical axis 130, such as in region 60, a principal or average ray angle of a bundle of incident light rays 160 incident upon surface plane 126 of array 30 is substantially normal (i.e. perpendicular to) to surface plane 126. As such, the conventional configuration of pixel 34 as illustrated by FIG. 3 and FIG. 4 is effective at allowing incident light rays 160 to reach PD 42.

However, the principal ray angle of a bundle of incident rays incident upon surface plane 126 deviates from normal with the distance from optical axis 130. In general, the deviation of the principal ray angle from normal increases in a non-linear fashion with distance from optical axis 130, with a maximum deviation occurring proximate to the edges of array 30 (i.e. the greatest distance from optical axis 130). The deviation results primarily from what is commonly referred to as the "non-telecentricity" of the lens utilized by an imaging device (not shown) employing imaging array 30. This deviation results in the conventional pixel structure (primarily the metal-2 76 elements) of pixel 32 of FIG. 3 and FIG. 4 causing shadowing (or "geometric shadowing") of the associated photodetector PD 42 or the photodetector of an adjacent pixel, with the shadowing effects worsening as the pixels become more removed from optical axis 130. The shadowing reduces the light intensity received by the pixels, especially those pixels proximate to the edges of imaging array 30, which already see a reduction in light intensity relative to those pixels proximate the optical axis 130 from what is commonly referred to as vignetting (caused by 1/Cosine characteristics of the lens).

For example, if pixel 32 having the conventional configuration of FIG. 4 is positioned at region 62 of array 30 in lieu of region 60 (see FIG. 1), the principal ray angle of incident light upon surface plane 126 would deviate significantly from normal as illustrated by the bundle of incident rays at 162. As a result, when positioned at region 62, BIT line 56 of metal-2 76 blocks incident light to photodetector 120 of adjacent pixel 122, consequently reducing the brightness of an image produced by adjacent pixel 122.

Similarly, if pixel 32 having the conventional configuration of FIG. 4 is positioned at region 64 of array 30, opposite optical axis 130 from region 62 (see FIG. 1), the principle ray angle of incident light upon surface plane would deviate significantly from normal (by a same magnitude but opposite angle from the deviation at region 62) as illustrated by the bundle of incident rays 164. As result, when positioned at region 64, PVDD line 54 of metal-2 76 blocks incident light to PD 42, consequently reducing the brightness of an image produced by pixel 32.

In accordance with the present invention, and as illustrated by FIG. 5 through FIG. 8 below, the metal-2 elements and corresponding vias of pixels 32 (i.e. PVDD and BIT lines 54, 56 and vias 110, 112 in the illustrated examples) are shifted toward optical axis 130 based on their distance from and position to (i.e. to the right or left relative to FIG. 1) optical axis 130. Shifting the metal-2 elements and their corresponding vias toward the optical center of imaging array 30 in accordance with the present invention reduces light shadowing associated with conventional pixel structures.

Metal-1 74 elements (e.g. segment 100) are positioned in closer proximity to surface 128 of the silicon substrate and further away from imaging plane 126 than metal-2 76 elements. As such, metal-1 74 elements generally have little impact on geometric shadowing effects. Geometric shadowing is generally caused by pixel components in layers above metal-1 74 and closer to image plane 126, such as the elements of metal-2 76 as described herein. However, in some pixel architectures, metal-1 74 elements may contribute to geometric shadowing effects. As such, although described herein with respect to metal-2 76 elements and associated interlayer connect elements, the teachings of the present invention (as will be described in greater detail below) can also be applied to metal-1 74 elements and associated interlayer connect elements. The teaching of the present invention can also be applied to elements in metal layers beyond metal-1 and metal-2 when a pixel architecture employs such additional metal layers.

Figure 5:
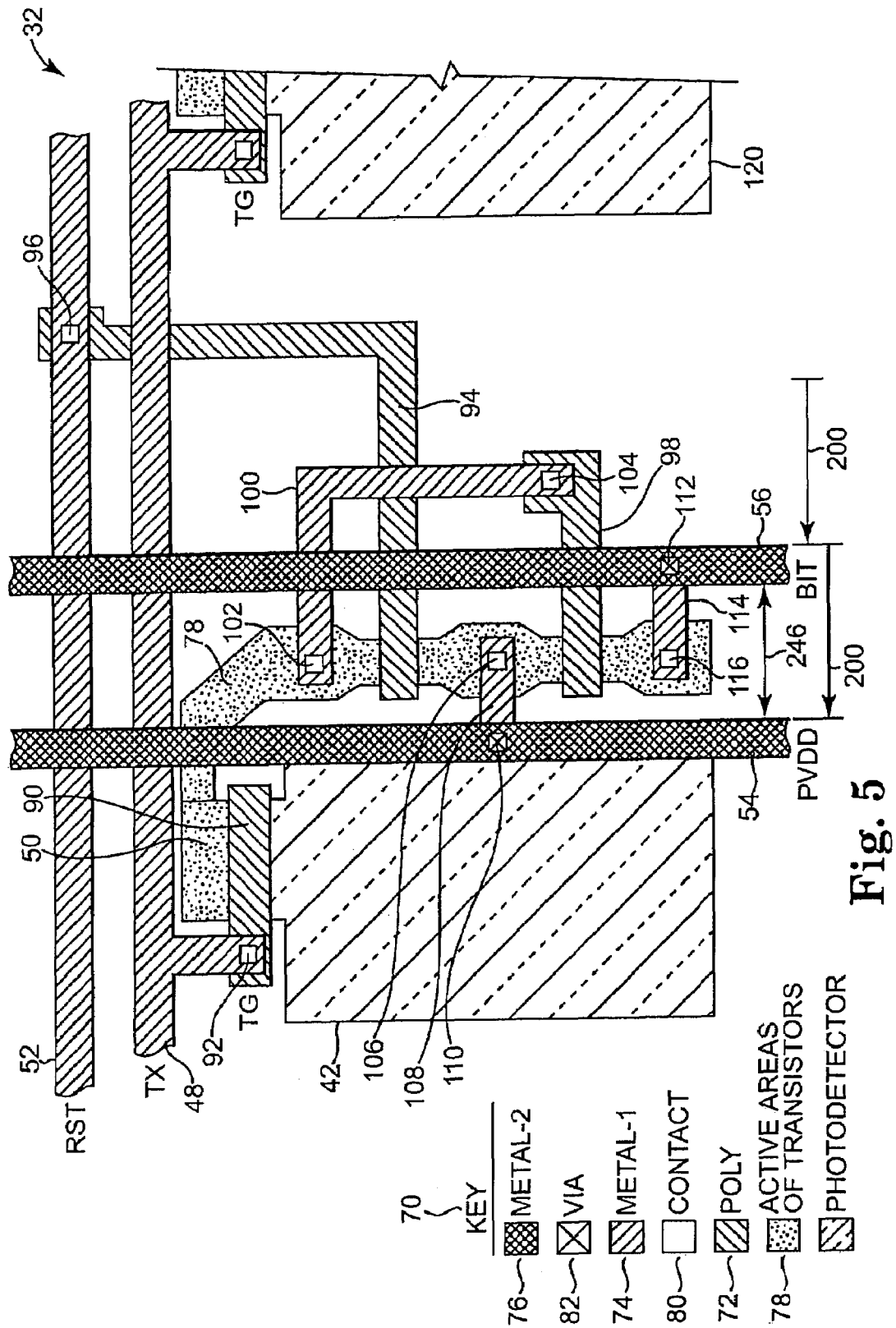
FIG. 5 is an example layout of the pixel of FIG. 2 having shifted metal route positions according to the present invention.
Figure 6:
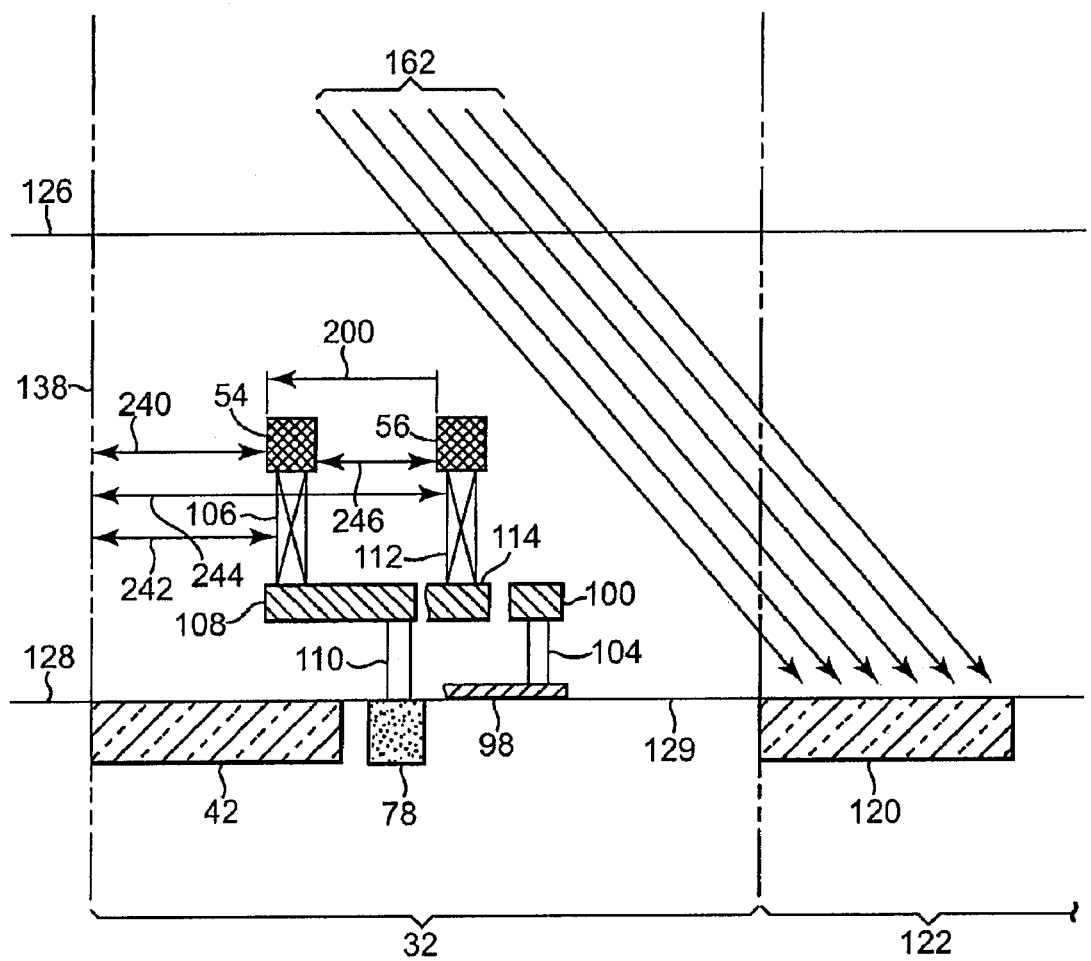
FIG. 6 is a cross-sectional view illustrating portions of the pixel of FIG. 5.

FIGS. 5 and 6 illustrate an example layout of pixel 32 in accordance with the present invention when located in region 62 of imaging array 30. As illustrated, PVDD and BIT lines 54, 56 of metal-2 76 and the corresponding vias 110 and 112 are shifted toward edge 38 by a shift distance 200 relative to their corresponding positions when pixel 32 is located at position 60 (as illustrated by FIGS. 3 and 4). The magnitude of shift distance 200 is based on the distance of pixel 32 from the optical center 130 of imaging array 30. The direction of shift distance 200 depends on the relative position of pixel 32 to optical center 130. Since edge 138 of pixel 32 of FIGS. 5 and 6 faces toward of optical center 130, the direction of shift distance 200 is toward edge 138 (i.e. to the "left" in FIGS. 1, 5, and 6).

With further reference to FIG. 4, distances 240, 242, and 242 between PVDD line 54, and vias 106, 112 respectively to edge 138 are less than distances 140, 142, and 144 by an amount equal to shift distance 200. Since BIT line 56 is also shifted toward edge 138 by shift distance 200, the distance 256 between PVDD and BIT lines 54, 56 is equal to distance 156. As illustrated by FIGS. 5 and 6, the positions and dimensions of metal-1 74 segments 108 and 114 have been adjusted accordingly.

As illustrated by FIG. 6, with PVDD and BIT lines 54, 56 of metal-2 76 and corresponding vias 106, 112 shifted toward edge 138 by shift distance 200, the bundle of incident light rays 162 is no longer blocked and has an unobstructed path to PD 120 of adjacent pixel 122. Additionally, even though PVDD line 54 of metal-2 76 is positioned between PD 42 and surface plane 126, a bundle of light rays (not illustrated) incident upon pixel 32 has a principal ray angle similar to that of the bundle of lights rays 162 and, thus, will not be blocked by PVDD line 54.

Figure 7:
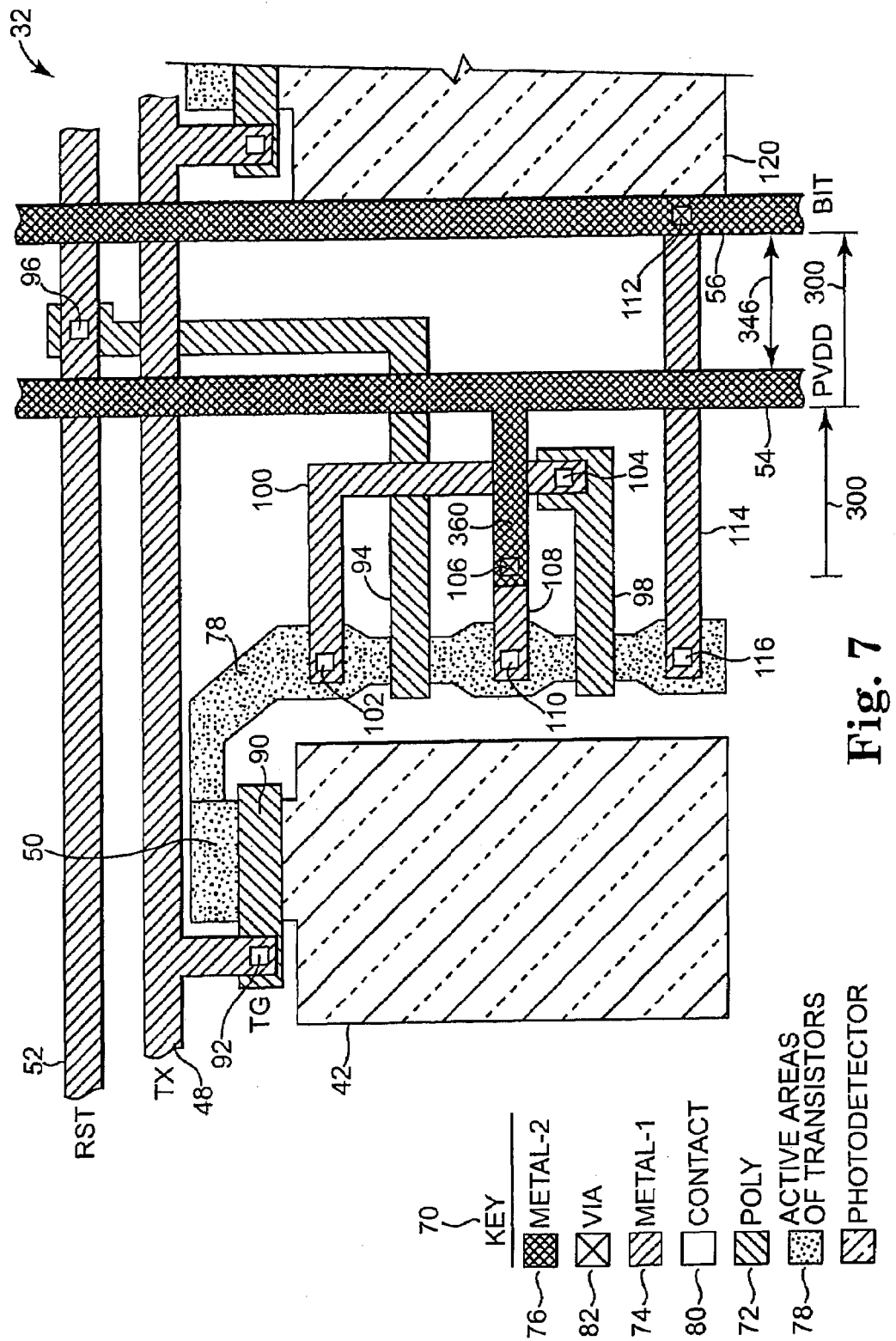
FIG. 7 is an example layout of the pixel of FIG. 2 having shifted metal route positions according to the present invention.

FIGS. 6 and 7 illustrate an example layout of pixel 32 in accordance with the present invention when located at region 64 of imaging array 30. As illustrated, PVDD and BIT lines 54 and 56 of metal-2 76 are shifted away from edge 138 by a shift distance 300 relative to their corresponding positions when pixel 32 is located at region 60 (as illustrated by FIGS. 3 and 4). As when pixel 32 is located at region 62 (as illustrated by FIGS. 5 and 6), the magnitude and direction of shift distance 300 are based respectively on the distance pixel 32 is from and the relative position of pixel 32 to optical center 130 of imaging array 30. Since edge 138 of pixel 32 of FIG. 7 and 8 faces away from optical center 130, the direction of shift distance 300 is away from edge 138 (i.e. to the "right" in FIGS. 1, 7, and 8). In the illustrated example, region 64 is at substantially an equal distance from optical center 130 of array 30 ad region 62.

However, unlike when pixel 32 is located at region 62 (as illustrated by FIGS. 5 and 6), only via 112 associated with BIT line 56 is shifted toward optical center 130 (i.e. to the right) by shift distance 300. Because the pixels are so densely packed within the silicon substrate, the locations of the photodetectors and active transistor areas (e.g. PD 42 and active areas 78), the transistors (e.g. reset transistor 44 and source-follower transistor 46) and associated contacts (e.g. contacts 102, 104, 110, and 116) are at substantially fixed positions. As such, metal-1 72 segment 100 coupling the source of reset transistor 44 to the gate of source-follower transistor 46 is at a substantially fixed location.

Since via 106 couples PVDD line 54 to the drains of reset and source-follower transistors 44, 46 by metal-1 72 segment 108, via 106 cannot be shifted along with PVDD line 54 by shift distance 300 because such a shift would require metal-1 72 segment 108 to be extended across metal-1 72 segment 100. As such, via 106 is at a substantially fixed position. Therefore, in order to maintain electrical connection between the shifted PVDD 54 and the drains of reset and source-follower transistors 44, 46, a metal-2 76 span element 360 is added to pixel 32 to couple PVDD 54 to via 112.

In one embodiment, span element 360 is contiguous with and extends from PVDD 54 to via 106 by a distance at least equal to shift distance 300. In one embodiment, span element 360 is contiguous with and extends from PVDD 54 to via 106 by a distance substantially equal to shift distance 300. Although illustrated as extending from PVDD 54 in a linear fashion, in other embodiments, span element may include bends and angles to avoid conflicts with other pixel elements (not illustrated) which may be positioned between PVDD 54 and via 106.

Figure 8:
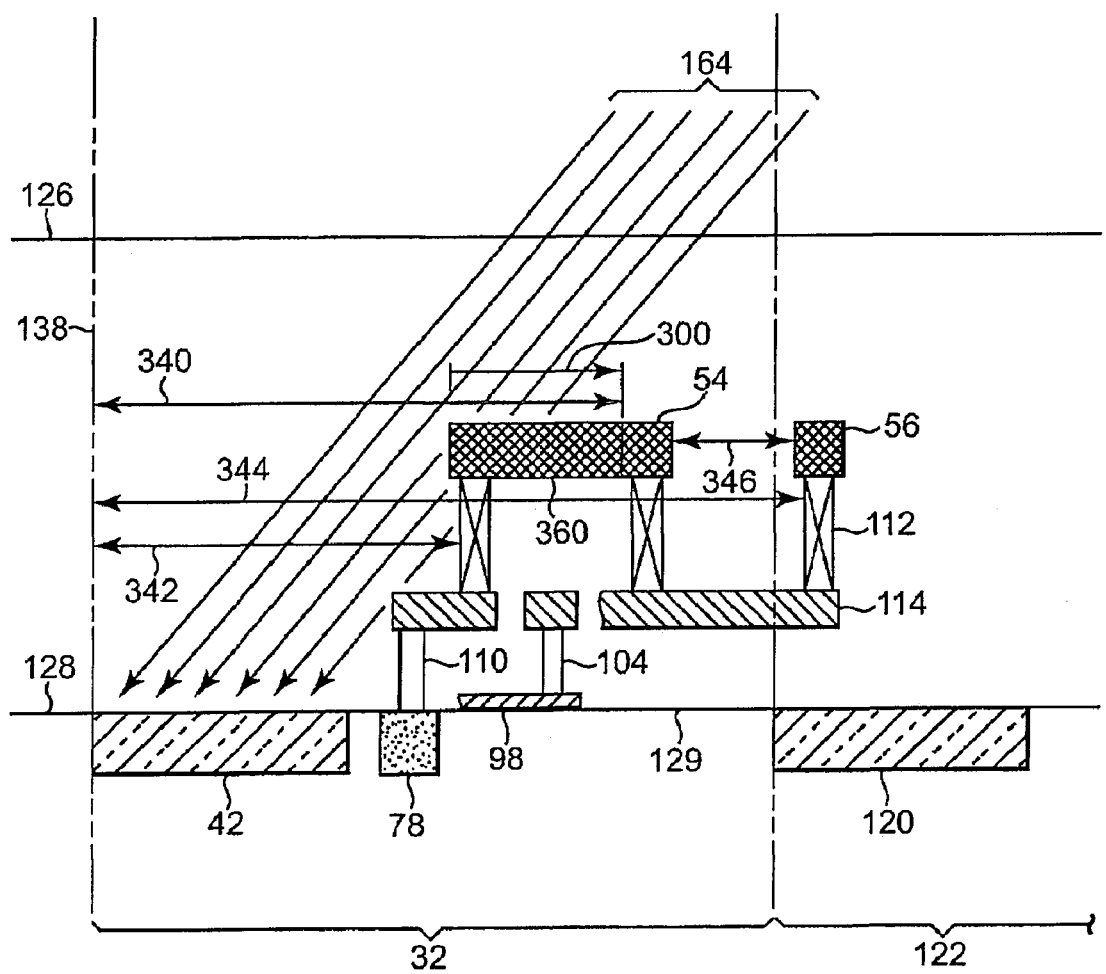
FIG. 8 is a cross-sectional view illustrating portions of the pixel of FIG. 7.

With further reference to FIG. 4, distances 340 and 344 between PVDD line and 54 and via 112 respectively to edge 138 are greater than distances 140 and 144 by an amount equal to shift distance 300. Since BIT line 56 is also shifted away from edge 138 by shift distance 300, the distance 356 between PVDD and BIT lines 54, 56 is equal to distance 156. As illustrated by FIGS. 7 and 8, metal-1 72 segment 114 has been extended by shift distance 300.

As illustrated by FIG. 8, with PVDD and BIT lines 54, 56 of metal-2 76 shifted away from edge 138 by shift distance 300, the bundle of incident light rays 164 is no longer blocked and has an unobstructed path to PD 42. Additionally, even though BIT line 56 of metal-2 76 is positioned between surface plane 126 and PD 120 of adjacent pixel 122, a bundle of light rays (not illustrated) incident upon pixel 32 has a principal ray angle similar to that of the bundle of light rays 164 and, thus, will not be blocked by BIT line 56.

As described above, the principal ray angle of light incident upon imaging array 30 varies non-linearly with distance from optical axis 130 across imaging array 30, with the greatest deviations occurring along the edges of imaging array 30. As such, the magnitude in the shift distance of metal-2 76 elements for each pixel 32 of array 30 is dependent on the distance of the pixel from optical axis 130. The magnitude of the shift distance is also dependent on the distance of metal-2 76 from surface plane 126. Thus, in general, the shift distances are greater in magnitude for pixels 32 situated further away from optical axis 130 than for pixels situated closer to optical axis 130. Also, due to the non-linear nature of the deviations from normal of the principal ray angle across array 30, the magnitudes of shift distances also increases non-linearly as the pixels become further removed from optical axis 130.

Figure 9:
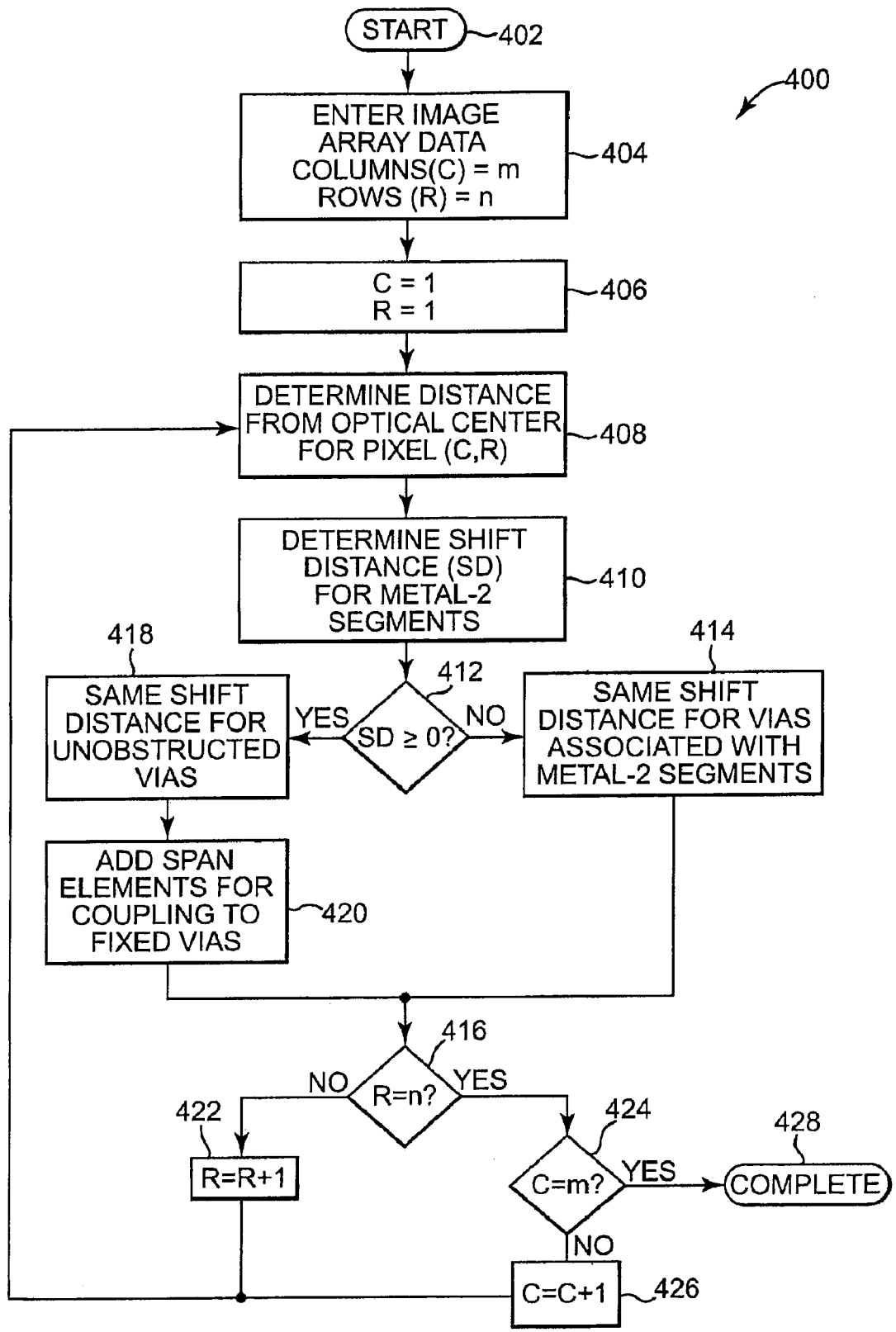
FIG. 9 is a flow diagram illustrating generally one embodiment of a process for shifting metal route positions according to the present invention.

FIG. 9 is a flow diagram illustrating one example embodiment of a process 400 for determining shift distances for each pixel of an array of pixels to be fabricated, such as pixels 32 of array 30. Process 400 begins at 402. At 404, parameters/data associated with the imaging array to be fabricated are determined and include information such as the number "m" of columns (C) and the number "n" of rows (R) of the imaging array, a "conventional" or base configuration of a pixel of the array (e.g. pixel 32 of FIG. 3 and FIG. 4, and including dimensions describing the pixel structure), and data related to a lens configuration to be utilized with the array (including non-linear characteristics of the principal ray angles associated with the lens).

At 406, the values for column counter (C) and row counter (R) are each set to a value of "1". At 408, based on the dimensions of the array entered at 404, an optical center of the array is determined. Based on the value of C and R, the distance of the present pixel (R, C) from the optical center is determined.

At 410, based on the distance from optical center as determined at 408 and the non-linear characteristics of the principal ray angle and dimensions of the base pixel structure from 404, a shift distance (SD) is determined for the metal-2 elements of the present pixel (R, C)

At 410, process 400 queries whether the SD is greater than or equal to zero. If the answer to the query is "no", process 400 proceeds to 414. At 414 (with additional reference to FIGS. 1, 5, and 6), since SD is less than zero, the present pixel (R, C) is located to the "right" of the optical center and the metal-2 segments are being shifted to the "left". As such, there are no fixed transistors or connecting elements (e.g. segment 100 of FIG. 3) preventing movement of vias associated with metal-2 segments, and the vias will be shifted by the same SD as the corresponding metal-2 segments. Process 400 then proceeds to 416.

If the answer to the query at 412 is "yes", process 400 proceeds to 418. At 418 (with additional reference to FIGS. 1, 5, and 6), since SD is greater than zero, the present pixel (R, C) is located to the "left" of the optical center and the metal-2 segments are being shifted to the "right". As such, there are fixed transistors and/or connecting elements (e.g. segment 100 of FIG. 7) which prevent movement of vias associated with metal-2 segments. As such, vias of present pixel (R, C) which are not obstructed will be shifted by the same SD as the corresponding metal-2 segments, and vias whose movement is obstructed will remain at their "base" position.

Process 400 then proceeds to 420, where span elements are added to the pixel structure of the present pixel (R, C) to couple the fixed vias to their corresponding shifted metal-2 segments. In one embodiment, a length of the span elements is substantially equal to SD of the present pixel (R, C). Process 400 then proceeds to 416.

At 416, process 400 queries whether row counter "R" is equal to the number "n" of rows in the array to be fabricated. If the answer to the query is "no", shift distances have not been determined for all pixels of the current row "R", and process 400 proceeds to 422. At 422, row counter "R" is incremented by a value of "1" and process 400 returns to 408 where the above described process is repeated for the next pixel of the present column "C."

If the answer to the query at 416 is "yes", shift distances have been determined for all pixels of the current column "C", and process 400 proceeds to 424. At 424, process 400 queries whether column counter "C" is equal to the number "m" of columns in the array to be fabricated. If the answer to the query is "no", shift distances have not been determined for all columns of pixels of the array to be fabricated, and process 400 proceeds to 426. At 426, column counter "C" is incremented by a value of "1" and process 400 returns to 408 to determine shift distances for all pixels of the next column of pixels. If the answer to the query at 424 is "yes", shift distances have been determined for all pixels of the array to be fabricated and process 400 is complete, as indicated at 428.

The above described process can be performed using a computer program on a computer system. For example, the characteristics of a bundle of light rays (e.g. the principal ray angle) incident upon each pixel 32 of array 30 can be determined by modeling the associated lens system. The placement of metal-2 segments, the corresponding vias, and required span elements can then be determined algorithmically based on the characteristics of the corresponding bundle of light rays so as to optimize a pixel operating parameter (e.g. photo radiation incident upon the photodetector). While original software may be developed, one example of a commercially available product that can be employed to perform the above described process is SKILL SCRIPT® in CADENCE IC Design Tools®.

In summary, by shifting the metal interconnect segments and corresponding vias in accordance with the present invention, the present invention provides pixel structures that significantly reduce photodetector shadowing, thereby increasing the brightness of images produced by the pixel. Additionally, by determining and providing span elements in accordance with the present invention, metal interconnect segments associated with fixed circuit elements, such as vias, are shifted while maintaining in required electrical communication with pixel elements.

Additionally, although described herein primarily with regard to a CMOS buried-gated photodiode type pixel employing three transistors and having metal interconnect segments disposed in two metal layers, the teachings of the present invention can be adapted to apply to other types of CMOS pixel architectures employing varying numbers of transistors and interconnects and more than two metal layers, and to other types of pixels (e.g. CCD type pixels).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of configuring an image sensor including an array of pixels having an optical center, each pixel of the array including a transistor region, a first metal segment disposed in a first metal layer on one side of the transistor region, a second metal segment disposed in the first metal layer and coupled to the transistor region, a third metal segment disposed in a second metal layer and an interlayer connect element coupled between the third metal segment and the first metal segment, the method comprising:
   modeling a base pixel configuration for each pixel of the array, the base pixel configuration including:
   the third metal segment at a first position in the second metal layer; and
   the interlayer connect element at a second position which is coincident with the first position; and
   for each pixel of the array:
   determining a shift distance for the pixel based on a distance of the pixel from the optical center;
   shifting the third metal segment from the first position toward the optical center by the shift distance to a shifted location;
   determining whether the first metal segment obstructs coupling between the third metal segment at
   the shifted location and the second metal segment;
   shifting the interlayer connect element from the second position toward the optical center by the shift distance if the first metal segment does not obstruct coupling between the third metal segment at the shifted location and the second metal segment; and
   maintaining the interlayer connect element at the second position and using a span element to couple the third metal segment at the shifted location to the interlayer connect element if the first metal segment obstructs the coupling between the third metal segment at the shifted location and the second metal segment.

2. The method of claim 1, wherein the determining of the shift distance includes determining an angle of incidence of a principal ray angle of a bundle of light rays incident upon the pixel.

3. The method of claim 1, wherein the coupling of the span element includes extending the span element by at least the shift distance to the interlayer connect element.

4. A method of configuring an image sensor having an array of pixels arranged into rows and columns, the array having an optical center plane substantially parallel to the columns, and each pixel including a photodetector, a transistor region, first and second metal segments positioned in a first metal layer, a further metal segment positioned in a second metal layer, and an interconnect element coupled between the further metal segment and the second metal segment, the second metal segment coupled to the transistor region, the method comprising:

determining a base pixel configuration wherein the further metal segment is positioned a segment distance and the interconnect element is positioned an interconnect distance from an edge of the pixel proximate to the photodetector, the segment distance being substantially equal to the interconnect distance; and for each pixel of the array:

determining a shift distance of the pixel based on a distance of the pixel from the optical center plane;

decreasing the segment distance and the interconnect distance by the shift distance if the photodetector is positioned between the transistor region and the optical center plane to shift the further metal segment to a shifted location, and increasing the segment distance by the shift distance if the transistor region is positioned between the photodetector and the optical center plane to shift the further metal segment to the shifted location;

determining if the first metal segment obstructs a path in the first metal layer between the second metal segment and an area of the first metal layer coincident with the shifted location of the further metal segment; and if the first metal segment obstructs the oath between the second metal segment and the area of the first metal layer coincident with the shifted location of the further metal segment, coupling a span in the second metal layer between the further metal segment and the interconnect element.

5. The method of claim 4, wherein the base pixel configuration is suitable for pixels receiving a bundle of incident light rays having a principal ray angle substantially perpendicular to the photodetector.

6. The method of claim 4, wherein the base pixel configuration is suitable for pixels wherein the optical center plane passes through the photodetector.

7. The method of claim 4, wherein the determining of the shift distance includes determining an angle of incidence of a principal ray of a bundle of light rays incident upon the pixel.

8. The method of claim 7, wherein the image sensor includes a lens, and wherein the determining of the angle of incidence includes modeling optical characteristics of the lens.

9. The method of claim 4, wherein for pixels in a given row of the array, the shift distance increases with increasing distance of the pixels from the optical center plane.

10. The method of claim 4, wherein the shift distance is the same for each pixel in a given column of pixels.

11. The method of claim 4, wherein the shift distance increases non-linearly with distance of the pixel from the optical center plane.

12. The method of claim 4, wherein the coupling of the span includes providing the span element with a length at least equal to the shift distance.

13. An image sensor comprising:

an array of pixels arranged into rows and columns, the array having an optical center plane substantially parallel to the columns, and each pixel including a photodetector, a transistor region, first and second metal segments positioned in a first metal layer, at least one further metal segment positioned in a second metal layer, an interconnect element coupled between the at least one further metal segment and the second metal segment, and having a first pixel edge proximate to the photodetector;

wherein each pixel of at least one column of the array proximate to the optical center plane has a center configuration wherein the at least one further metal segment is positioned a segment distance from the first pixel edge and the interconnect element is positioned an interconnect distance from the first pixel edge;

wherein for each pixel of the remaining columns of the array to one side of the at least one column, the at least one further metal segment is positioned at the segment distance minus a shift distance and the interconnect element is positioned at the interconnect distance minus the shift distance from the corresponding first pixel edge;

wherein for each pixel of the remaining columns of the array to the other side of the at least one column, the at least one further metal segment is positioned at the segment distance plus the shift distance and the interconnect element is positioned at the interconnect distance from the corresponding first pixel edge, and wherein, for each pixel having a path in the first metal layer between the second metal segment and an area in the first metal layer coincident with the at least one further metal segment obstructed by the first metal segment, a span element is positioned in the second metal layer that extends between the at least one further metal segment and the interconnect element; and wherein the shift distance is based on a distance of the pixel from the optical center plane.

14. The image sensor of claim 13, wherein the pixels in the remaining columns to the one side of the at least one column are positioned such that the photodetector is positioned between the transistor region and the optical center plane, and the pixels in the remaining columns to the other side of the at least one column are positioned such the transistor region is positioned between the photodetector and the optical center plane.

15. The image sensor of claim 13, wherein a magnitude of the shift distance increases non-linearly with increasing distance of the pixel from the at least one column of pixels.

16. The image sensor of claim 13, wherein the shift distance is based on an angle of incidence of a principle ray of a bundle of light rays incident upon the pixel.

17. The image sensor of claim 13, wherein the span element has a length at least equal to the shift distance of the corresponding pixel.

18. The image sensor of claim 13, wherein the image sensor comprises a complimentary metal-oxide semiconductor imaging sensor and each pixel of the array comprises a buried-gate photodiode type pixel.

19. The image sensor of claim 13, wherein the at least one further metal segment comprises a portion of a signal bus extending across the array.

* * * * *

UNITED STATES PATENT AND TRADEMARK OFFICE
CERTIFICATE OF CORRECTION

PATENT NO. : 7,408,140 B2  Page 1 of 1
APPLICATION NO. : 11/678986
DATED : August 5, 2008
INVENTOR(S) : Gazeley It is certified that error appears in the above-identified patent and that said Letters Patent is hereby corrected as shown below:

On the Title page, in field (57), under "Abstract", in column 2, line 21, delete "on" and insert -- in --, therefor.

In column 1, line 9, after "PIXEL" insert -- WITH --.

In column 11, line 37, in Claim 4, delete "oath" and insert -- path --, therefor.

In column 12, line 46, in Claim 14, after "such" insert -- that --.

Signed and Sealed this

Twenty-first Day of October, 2008

JON W. DUDAS
*Director of the United States Patent and Trademark Office*